United States Patent
Sakamori

(10) Patent No.: US 6,638,777 B2
(45) Date of Patent: Oct. 28, 2003

(54) APPARATUS FOR AND METHOD OF ETCHING

(75) Inventor: Shigenori Sakamori, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 7 days.

(21) Appl. No.: 10/118,955

(22) Filed: Apr. 10, 2002

(65) Prior Publication Data

US 2003/0082911 A1 May 1, 2003

(30) Foreign Application Priority Data

Oct. 30, 2001 (JP) ........................................ 2001-332364

(51) Int. Cl.$^7$ ........................ H01L 21/00; H01L 21/306
(52) U.S. Cl. ............................................ 438/5; 204/193
(58) Field of Search ................................. 438/689, 712, 438/745, 593, 5, 8; 216/59, 84; 156/345.1; 204/298.32, 193

(56) References Cited

FOREIGN PATENT DOCUMENTS

| JP | 6-302557 | 10/1994 |
|----|----------|---------|
| JP | 11-330185 | 11/1999 |

*Primary Examiner*—Evan Pert
*Assistant Examiner*—Monica D. Harrison
(74) *Attorney, Agent, or Firm*—Oblon, Spivak, McClelland, Maier & Neustadt, P.C.

(57) ABSTRACT

A film thickness measuring mechanism is provided in an orienter chamber (A or B) or a transport buffer chamber (5) of an etching apparatus. A wafer subjected to a predetermined etching process in an etching chamber (1), for example, is transported temporarily into the orienter chamber (A or B) or the transport buffer chamber (5) in which the film thickness measuring mechanism, in turn, measures an etch depth for the wafer. If the etch depth is out of predetermined tolerance with respect to an etch depth setting, an additional etching process is performed on the wafer. Etch time for the additional etching process is calculated from the actual etch depth measured by the film thickness measuring mechanism, the etch depth setting, and an etch rate of a film to be etched.

14 Claims, 7 Drawing Sheets

FIG. 2

| STEP No. | 1 | 2 | 3 | 4 | 5 |
|---|---|---|---|---|---|
| Time (sec) | ... | ... | ... | 65 | ... |
| Etch Depth Setting $D_{set}$ (nm) | ... | ... | ... | 200.0 | ... |
| Pressure (Pa) | ... | ... | ... | 2 | ... |
| rf Power (W) | ... | ... | ... | 1500 | ... |
| GAS 1 (sccm) | ... | ... | ... | 30 | ... |
| GAS 2 (sccm) | ... | ... | ... | 30 | ... |
| GAS 3 (sccm) | ... | ... | ... | 1000 | ... |
| ... | ... | ... | ... | ... | ... |
| Standard Etch Rate R1 (nm/min) | ... | ... | ... | 184.0 | ... |

ETCH RATE = $a_0 + a_1 \cdot t + a_2 \cdot t^2 + a_3 \cdot t^3 + a_4 \cdot t^4$
t : ETCH TIME F I G . 8 A
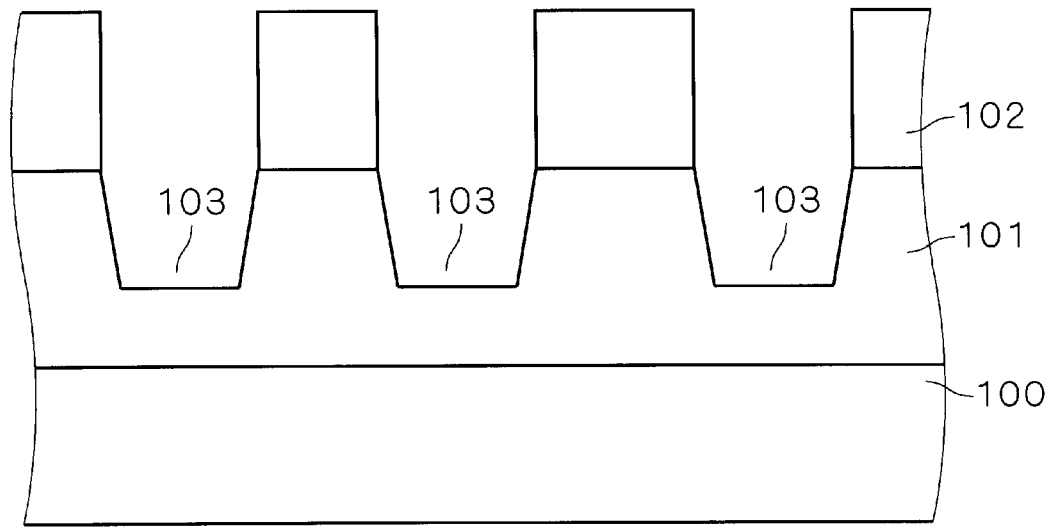
F I G . 8 B
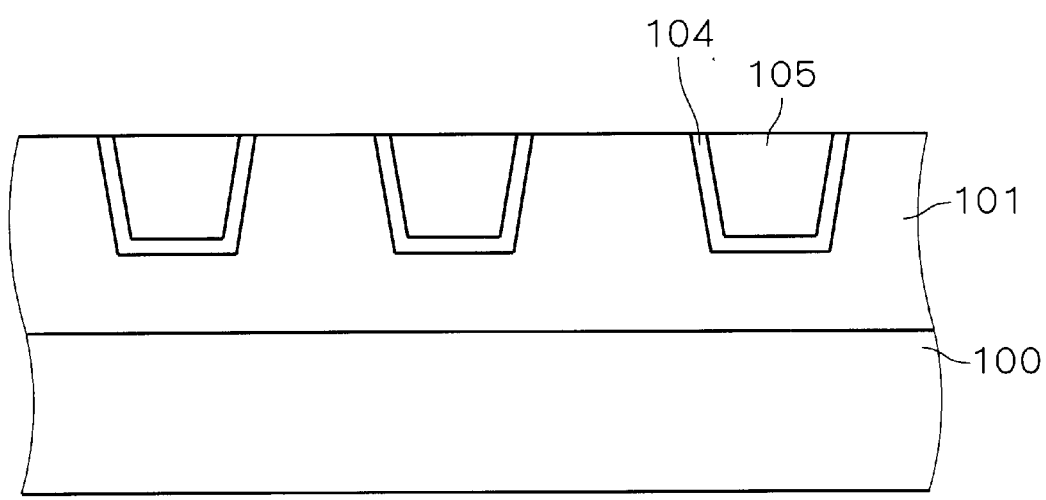

APPARATUS FOR AND METHOD OF ETCHING

BACKGROUND OF THE INVENTION

1. Field of the Invention

The present invention relates to an apparatus for and method of manufacturing a semiconductor device. More particularly, the invention relates to an apparatus for and method of etching.

2. Description of the Background Art

With recent increase in scale of integration of semiconductor devices, high-finishing-accuracy micro-etching techniques have been increasingly important. For instance, a plasma etching technique is known as a process suitable for micromachining, and is often used in the step of trench formation for forming finer interconnect lines on a semiconductor substrate.

FIGS. 8A and 8B show the steps of forming buried interconnect lines in a background art method of manufacturing a semiconductor device. The background art method of manufacturing the semiconductor device will be described with reference to FIGS. 8A and 8B. First, a to-be-etched film 101 in which buried interconnect lines are to be formed is formed on a semiconductor device 100. Then, a photoresist film is formed on the film 101 and is selectively removed in portions to be trenched, to form a resist pattern 102. Using the resist pattern 102 as a mask, etching is performed on the film 101 to form trenches 103, as shown in FIG. 8A.

Then, the resist pattern 102 is removed. Barrier metal 104, e.g. TaN, is provided in the trenches 103, and the trenches 103 are filled with a wiring material, e.g. Cu. This forms buried interconnect lines 105, as shown in FIG. 8B.

Thus, the thickness of the buried interconnect lines 105 is determined by the depth of the trenches 103 formed in the film 101. Also, the thickness of the buried interconnect lines 105 greatly influences the resistance thereof. Therefore, variations in the depth of the trenches 103 result in variations in the resistance of the buried interconnect lines 105 from a design value to become a factor responsible for the decrease in semiconductor device manufacturing yield.

In an etching process, it has been relatively easily carried out, for example, to form a second film having an etch selectivity to the to-be-etched film under the to-be-etched film and to use the second film as a stopper to control an etch depth. In this case, the to-be-etched film in an etching region is completely removed. In other words, the etch depth is equivalent to the thickness of the to-be-etched film.

However, the above-mentioned trench formation process, in which the depth of the trenches in the to-be-etched film is less than the thickness of the to-be-etched film, is required to stop the etching without using the stopper, i.e., to etch the to-be-etched film to a desired depth. It is difficult for the background art etching method to precisely control the etch depth.

To overcome the difficulties, an attempt can be contemplated to monitor the depth of the trenches being formed using a film thickness measuring device of an optical interference type during the etching. However, it is in many cases difficult to place the film thickness measuring device in an etching chamber of an etching apparatus from a structural viewpoint. Additionally, even if the film thickness measuring device can be placed in the etching chamber, the monitoring in a plasma is difficult and impractical in the above-mentioned plasma etching process.

SUMMARY OF THE INVENTION

It is an object of the present invention to provide a method of and apparatus for etching capable of suppressing variations in etch depth.

A first aspect of the present invention is intended for an etching apparatus having an etching chamber for etching a film formed on a surface of a wafer, and at least one of a buffer chamber and an orienter chamber for establishing an orientation of the wafer. According to the present invention, the etching apparatus includes: an etching device for performing the etching; and an etch depth measuring device for measuring an etch depth resulting from the etching.

The etching device is provided in the etching chamber. The etch depth measuring device is provided in one of the buffer chamber and the orienter chamber. The etching device additionally performs the etching if the etch depth measured by the etch depth measuring device is less than a predetermined value.

The etching apparatus according to the present invention can suppress variations in etch depth, thereby to contribute to improvements in semiconductor device manufacturing yield. Additionally, since the orienter chamber and the transport buffer chamber are typically provided in a conventional common etching apparatus, there is no need to provide a new space for placement of a film thickness measuring device.

Preferably, the etching apparatus further includes a setting device for setting a value of a parameter associated with the etching, wherein the parameter includes an etch depth setting for the etching and an actual etch rate estimate.

The etching apparatus according to the prevent invention can precisely determine etch time for additional etching to suppress the variations in etch depth.

A second aspect of the present invention is intended for a method of etching a film formed on a surface of a wafer to a predetermined depth less than the thickness of the film. According to the present invention, the method includes the following steps (a) to (c).

The step (a) etches the film formed on a surface of a first wafer for first etch time. The step (b) measures a first etch depth, the first etch depth being an actual etch depth resulting from the etching in the step (a). The step (c) additionally performs the etching for additional etch time if the first etch depth is less than a predetermined value. The first etch time is calculated from an etch depth setting for the etching in the step (a) and a first etch rate, the first etch rate being an actual etch rate estimate. The additional etch time is calculated from the etch depth setting, the first etch depth and an additional etch rate, the additional etch rate being an actual etch rate estimate for the etching in the step (c).

In the method according to the present invention, the step (c) corrects variations in etch depth resulting from the etching in the step (a), to consequently suppress the variations in etch depth. This contributes to improvements in semiconductor device manufacturing yield.

Preferably, in the method of the present invention, the additional etch rate is the first etch rate.

In the method according to the present invention, the step (c) corrects the variations in etch depth resulting from the etching in the step (a) to consequently suppress the variations in etch depth.

Preferably, in the method of the present invention, the additional etch rate $R_{add}$ is calculated in accordance with the equation $R_{add} = D1_{act}/T1$ where $D1_{act}$ is the first etch depth, and T1 is the first etch time.

The method according to the present invention can precisely determine the additional etch rate $R_{add}$. Therefore, the step (c) precisely corrects the variations in etch depth resulting from the etching in the step (a) to consequently suppress the variations in etch depth.

Preferably, in the method of the present invention, the first wafer further includes an upper-layer film on the film. The method further includes the step of (d) etching the upper-layer film, the step (d) being performed before the step (a). The additional etch rate $R_{add}$ is calculated in accordance with the equation $R_{add}=(D1_{act}-D_v)/T1$ where $D1_{act}$ is the first etch depth, $D_v$ is an overetch depth in an upper surface of the film in the step (d), and T1 is the first etch time.

The method according to the present invention can correct the influence of the amount of overetching to determine the additional etch rate $R_{add}$. Therefore, the step (c) precisely corrects the variations in etch depth resulting from the etching in the step (a) to consequently suppress the variations in etch depth.

Preferably, the method of the present invention further includes the following steps (e) and (f). The step (e) performs the etching on the film formed on a surface of a second wafer for second etch time. The step (f) measures a second etch depth, the second etch depth being an actual etch depth resulting from the etching in the step (e). The additional etch rate $R_{add}$ is calculated in accordance with the equation $R_{add}=D2_{act}/T2$ where $D2_{act}$ is the second etch depth, and T2 is the second etch time.

The method according to the present invention can reduce the influence of a change in etch rate depending on the number of processed wafers in an etching apparatus to precisely determine the additional etch rate $R_{add}$. Therefore, the step (c) precisely corrects the variations in etch depth resulting from the etching in the step (a) to consequently suppress the variations in etch depth.

Preferably, the method of present invention further includes the step of (g) approximating a relationship between an etch rate and etch time of the film using a polynomial, wherein the additional etch rate is calculated based on the polynomial.

The method according to the present invention can precisely determine the additional etch rate if the relation between the etch rate and the etch time is not linear. Therefore, the step (c) precisely corrects the variations in etch depth resulting from the etching in the step (a) to consequently suppress the variations in etch depth.

Preferably, the method of present invention further includes the following steps (h) and (i). The step (h) performs the etching on the film formed on a surface of a third wafer for third etch time, the step (h) being performed before the step (a). The step (i) measures a third etch depth, the third etch depth being an actual etch depth resulting from the etching in the step (h). The first etch rate R1 is calculated in accordance with the equation $R1=D3_{act}/T3$ where $D3_{act}$ is the third etch depth, and T3 is the third etch time.

The method according to the present invention improves the accuracy of the etch depth resulting from the etching in step (a). This achieves the reduction in the number of wafers which need the additional etching process in the etching apparatus according to the present invention to contribute to improvements in semiconductor device manufacturing efficiency.

A third aspect of the present invention is intended for a method of etching a film formed on surfaces of a plurality of wafers to a predetermined depth less than the thickness of the film. According to the present invention, the method includes the following steps (a) to (c).

The step (a) performs the etching on the film formed on a surface of a first wafer for first etch time. The step (b) measures an actual etch depth resulting from the etching in the step (a). The step (c) performs the etching on the film formed on a surface of a second wafer for second etch time, the step (c) being performed after the step (b). The second etch time T2 is calculated in accordance with the equation $T2=D_{set}/(D_{act}/T1)$ where $D_{set}$ is an etch depth setting for the etching, $D_{act}$ is the actual etch depth measured in the step (b), and Ti is the first etch time.

The method according to the present invention improves the accuracy of the etch depth resulting from the etching in step (c). This contributes to the improvements in semiconductor device manufacturing efficiency.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 shows an example of an etch recipe for the etching apparatus according to the first preferred embodiment;

FIGS. 8A and 8B show the steps of forming buried interconnect lines in a background art method of manufacturing a semiconductor device.

DESCRIPTION OF THE PREFERRED EMBODIMENTS

First Preferred Embodiment

Figure 1A:
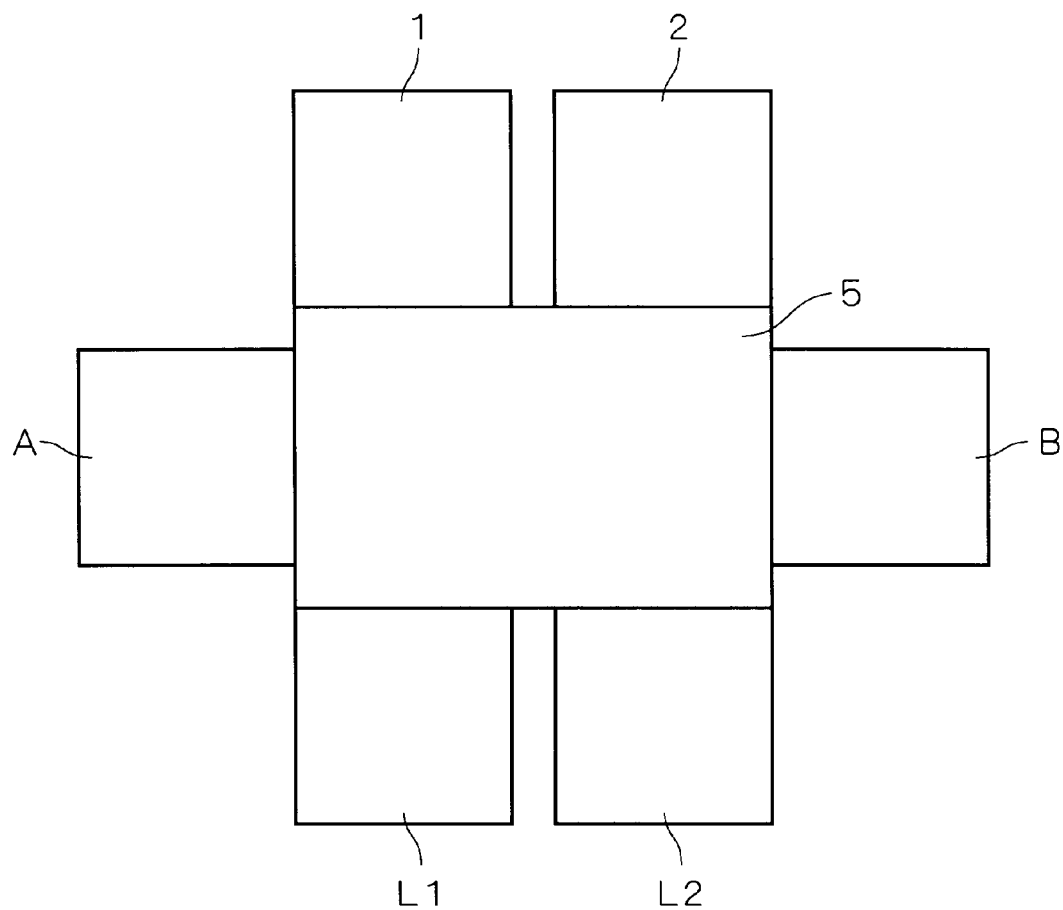
FIGS. 1A and 1B illustrate a construction of an etching apparatus according to a first preferred embodiment of the present invention.
Figure 1B:
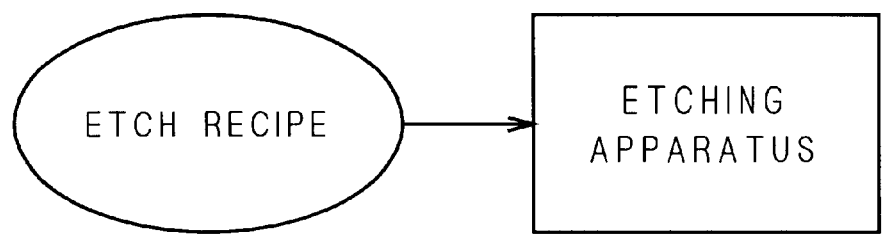

FIGS. 1A and 1B illustrate a construction of an etching apparatus according to a first preferred embodiment of the present invention. In FIG. 1A, the reference numerals 1 and 2 designate etching chambers with an etching device placed therein for etching a to-be-etched film and the like on a wafer; 5 designates a transport buffer chamber; the reference characters A and B designate orienter chambers comprising an orienter for establishing the orientation of a wafer with reference to a notch or an orientation flat of the wafer; and L1 and L2 designate load lock chambers for loading and unloading a wafer into and out of a cassette.

The etching apparatus according to the first preferred embodiment comprises a film thickness measuring mechanism in the orienter chamber A or B or in the transport buffer chamber 5.

The orienter chambers A, B and the transport buffer chamber 5 are typically provided in a conventional common etching apparatus. The provision of the film thickness measuring mechanism in the orienter chamber or the transport buffer chamber eliminates the need to provide a new space for placement of the film thickness measuring mechanism.

Referring to FIG. 1B, the etching apparatus according to the first preferred embodiment has a setting device for setting various parameters for an etching operation in etching steps based on an etch recipe indicating the parameters. In the first preferred embodiment, the parameters include an actual etch rate estimate and an etch depth setting.

An example of the actual etch rate estimate used herein may include a standard etch rate of the etching device determined by the material of the to-be-etched film, and the like. FIG. 2 shows an example of the etch recipe.

An operation of the etching apparatus according to the first preferred embodiment will be described. For purposes of description, the film thickness measuring mechanism will be described as provided in the orienter chamber A, as an example of placement of the film thickness measuring mechanism.

A wafer formed with a to-be-etched film is transported by a robot in the buffer chamber 5 from the load lock chamber L1 through the buffer chamber 5 into the orienter chamber A for notch alignment. After the notch alignment, the wafer is transported into the etching chamber 1 and subjected to an etching process (referred to hereinafter as a "normal etching process") for etching the film to a predetermined depth.

Etch time T1 in the normal etching process is calculated as $T1=D_{set}/R1$ where R1 (nm/min) is an actual etch rate estimate and $D_{set}$ (nm) is an etch depth setting both of which are set by the setting device based on an etch recipe therefor.

Upon completion of the normal etching process, the wafer is transported into the orienter chamber A. The film thickness measuring mechanism provided in the orienter chamber A measures the thickness of the etched film remaining after the etching process, thereby to measure an actual etch depth $D1_{act}$ (nm) resulting from the etching process. Thus, the film thickness measuring mechanism acts as an etch depth measuring device for measuring an etch depth in the normal etching process.

In the measurement of the etch depth, a measurement position setting on the wafer and settings of respective parameters required for the measurement differ depending on the types of semiconductor devices to be manufactured. It is, hence, necessary that the film thickness measuring mechanism is configured to change these settings depending on the types of semiconductor devices.

Then, a comparison is made between the etch depth setting $D_{set}$ (nm) in the normal etching process and the actual etch depth $D1_{act}$ (nm) measured by the film thickness measuring mechanism, and a judgment is made as to whether or not a difference, or error, of the actual etch depth from the setting is within tolerance. It is assumed herein that the tolerance is 10%.

If $D1_{act}<D_{set}\times0.9$, it is judged that the etch depth is insufficient, and an additional etching process is performed. In the additional etching process, etch time $T_{add}$ is calculated as $T_{add}=(D_{set}-D1_{act})/R1$ using the etch depth setting $D_{set}$, the actual etch depth $D1_{act}$ and the actual etch rate estimate R1.

In general, a plurality of wafers are successively etched in the etching apparatus. When one wafer is found to need the additional etching process, the next wafer is already being subjected to the etching process. Thus, the wafer which needs the additional etching process is temporarily returned to the cassette. The etching apparatus stores the etch time $T_{add}$ for the additional etching process of each wafer which needs the additional etching process.

After the completion of the normal etching process of all wafers in the cassette, the additional etching process is performed sequentially on the wafers having an insufficient etch depth by using the stored etch time $T_{add}$ for the additional etching process.

The above-mentioned operation corrects variations in etch depth resulting from the normal etching process by using the additional etching process to consequently suppress the variations in etch depth. This contributes to improvements in semiconductor device manufacturing yield.

Depending on the result of calculation of the etch time $T_{add}$ for the additional etching process, there are cases where the etch time $T_{add}$ for the additional etching process is much shorter as compared with the time required to transport or align the wafer for the additional etching process. Such an additional etching process is less effective considering the time required therefor, and can become a factor responsible for a significant reduction in semiconductor device manufacturing efficiency. Hence, the additional etching process may be dispensed with if the result of calculation of the etch time $T_{add}$ for the additional etching process is less than predetermined time. This suppresses the reduction in the semiconductor device manufacturing efficiency due to the additional etching process. Further, the etching apparatus may be adapted to allow a user to arbitrary set the predetermined time, thereby improving the controllability of the etching apparatus.

Second Preferred Embodiment

Figure 3:
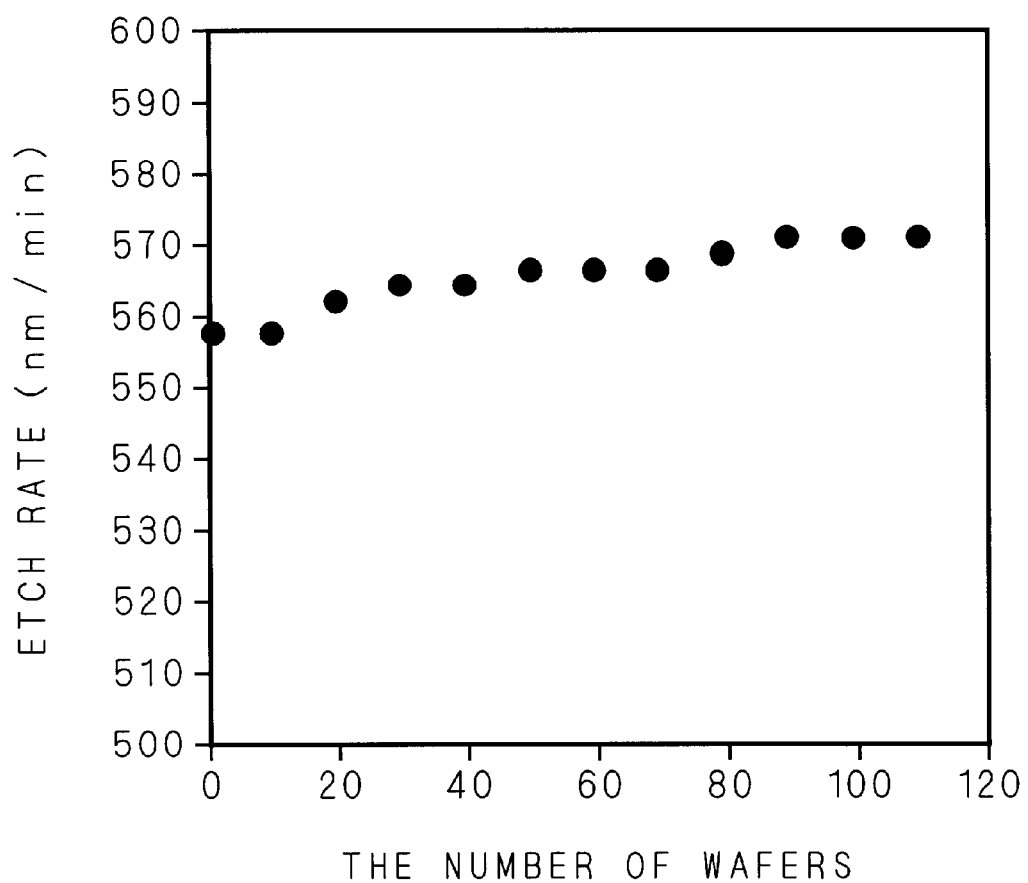
FIG. 3 is a graph showing a relationship between an etch rate and the number of processed wafers in a common plasma etching apparatus.

FIG. 3 is a graph showing a relationship between an etch rate and the number of processed wafers in a common plasma etching apparatus. The calculation of the etch time $T_{add}$ for the additional etching process in the first preferred embodiment uses the actual etch rate estimate R1 for the normal etching process as an actual etch rate estimate $R_{add}$ for the additional etching process. As shown in FIG. 3, however, the actual etch rate of the plasma etching apparatus gradually changes depending on the number of processed wafers. This change is considered to result from, for example, the influence of a deposition film deposited on the inner wall of a chamber in which the plasma etching is performed and the influence of wear of components of the etching apparatus.

Thus, there are cases where the actual etch rate estimate R1 for the normal etching process is not always appropriate as the actual etch rate estimate $R_{add}$ for the additional etching process. A second preferred embodiment of the present invention calculates the actual etch rate estimate $R_{add}$ for the additional etching process more precisely for the purpose of improving the accuracy of the etch depth after the additional etching process.

For example, when the actual etch depth $D1_{act}$ is measured after the etch time T1 in the normal etching process, the actual etch rate in the normal etching process is calculated as $D1_{act}/T1$.

Using the actual etch rate estimate $R_{add}=D1_{act}/T1$ for the additional etching process, the etch time $T_{add}$ for the additional etching process is given as $T_{add}=(D_{set}-D1_{act})/(D1_{act}/T1)$. This improves the accuracy of the etch depth of the additional etching process over that of the first preferred embodiment.

Further, the use of the actual etch rate of the etching immediately preceding the additional etching process as a parameter of the additional etching process further improves the etch depth accuracy. For example, it is assumed that the measurement of the etch depth after the normal etching process shows an insufficient etch depth and the additional etching process is judged to be performed. Then, the etching apparatus returns the wafer which needs the additional etching process temporarily into the cassette, and stores only an etch depth shortage ($D_{set}-D1_{act}$) calculated from the etch depth setting $D_{set}$ and the actual etch depth $D1_{act}$.

For the additional etching process, the actual etch rate estimate $R_{add}$ therefor is defined as an etch rate $D2_{act}/T2$ (nm/min) where T2 is etch time in the normal etching process immediately preceding the additional etching process (e.g., the normal etching process for the last wafer in the cassette) and $D2_{act}$ is an actual etch depth resulting from this normal etching process. Thus, the etch time $T_{add}$ for the additional etching process is calculated by $T_{add}=(D_{set}-D1_{act})/(D2_{act}/T2)$. This further improves the etch depth after the additional etching process to contribute to the improvements in the semiconductor device manufacturing yield.

Figure 4:
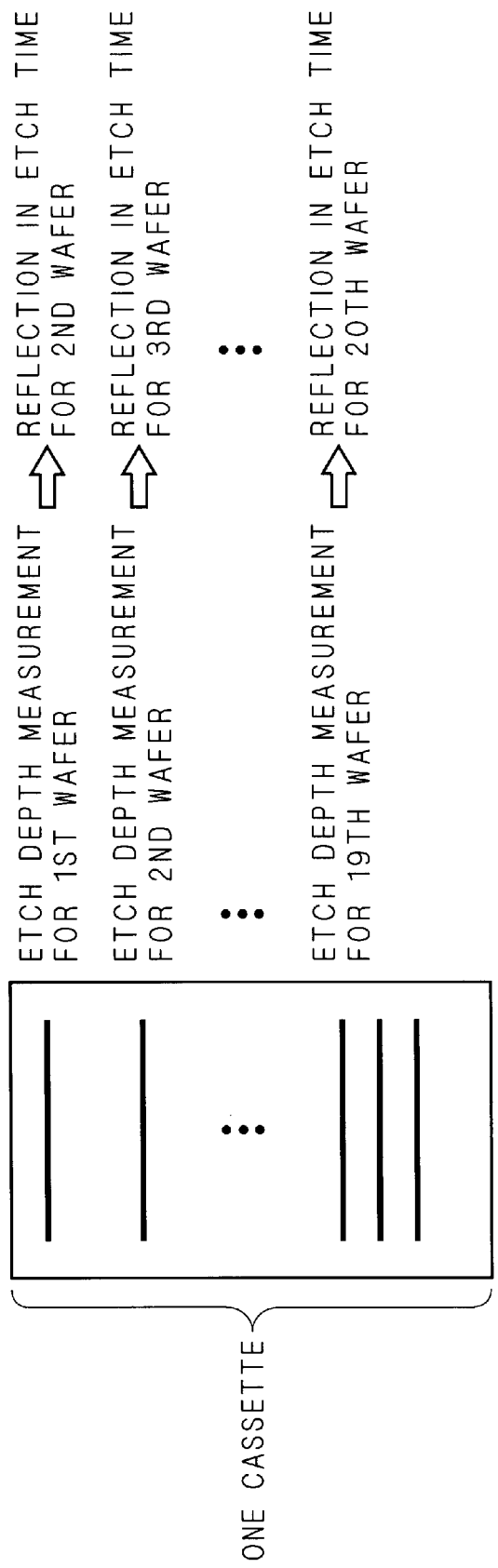
FIG. 4 illustrates an operation of the etching apparatus according to a second preferred embodiment of the present invention.

Although the calculation of the etch time for the additional etching process is discussed above, it is similarly effective to calculate the etch time for the normal etching process based on the etch rate of its immediately preceding etching operation. For example, the actual etch rate estimate RI of the normal etching process for a given wafer is expressed as $R1=D3_{act}/T3$ where T3 is etch time in the immediately preceding normal etching process and $D3_{act}$ is an actual etch depth resulting therefrom. Thus, the etch time T1 is calculated as $T1=D_{set}/(D3_{act}/T3)$ where $D_{set}$ is the etch depth setting. In other words, as illustrated in FIG. 4, the etching process for each wafer is caused to reflect the actual etch rate of its immediately preceding etching operation. This improves the accuracy of the etch depth in each normal etching process to reduce the number of wafers which need the additional etching process in the etching apparatus according to the second preferred embodiment, thereby contributing to improvements in the semiconductor device manufacturing efficiency.

Other components of the second preferred embodiment are similar to those of the first preferred embodiment discussed above, and will not be described herein.

Third Preferred Embodiment

The second preferred embodiment has been discussed based on the assumption that the to-be-etched film is a single-layer film and the normal etching process comprises the single etching step. The technique of the second preferred embodiment, however, is applicable to situations where the to-be-etched film has a multi-layer structure and the normal etching process comprises a plurality of etching steps.

Figure 5:
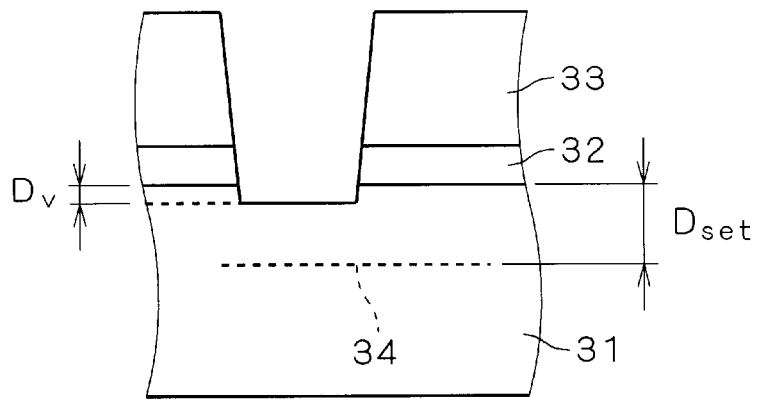
FIG. 5 illustrates an etching method according to a third preferred embodiment of the present invention.

FIG. 5 illustrates an etching method according to a third preferred embodiment of the present invention. With reference to FIG. 5, the to-be-etched film has a two-layer structure comprised of a lower-layer film 31 and an upper-layer film 32. The reference numeral 33 designates a photoresist, and 34 designates a position corresponding to the etch depth setting $D_{set}$ in the lower-layer film 31. The normal etching process according to the third preferred embodiment comprises two steps: etching away the upper-layer film 32 using the photoresist 33 as a mask, and then etching the lower-layer film 31 to a predetermined depth. In FIG. 5 is shown the film immediately after the step of etching the upper-layer film 32 using the photoresist 33 as a mask.

In the step of etching the upper-layer film 32, the lower-layer film 31 is also etched because of overetching in the case of a low selectivity between the upper-layer film 32 and the lower-layer film 31. In FIG. 5, $D_v$ denotes an overetch depth caused in the step of etching the upper-layer film 32. Then, the step of etching the lower-layer film 31 is performed to complete the normal etching process, which is followed by the actual etch depth measurement.

The actual etch rate in the etching of the lower-layer film 31 is calculated as $(D1_{act}-D_v)/T1$ where $D1_{act}$ is the actual etch depth of the lower-layer film 31 in the above-mentioned normal etching process, and T1 is the etch time in the step of etching the lower-layer film 31. The value of the overetch depth $D_v$ used in this calculation may include, for example, data derived from previous experimental etching, and a value calculated from the material of the to-be-etched film and etching conditions.

In the third preferred embodiment, the actual etch rate estimate $R_{add}$ for the additional etching process for the to-be-etched film having the two-layer structure shown in FIG. 5 is calculated as $R_{add}=(D1_{act}-D_v)/T1$. Thus, the etch time $T_{add}$ for the additional etching process is calculated as $T_{add}=(D_{set}-D1_{act})/((D1_{act}-D_v)/T1)$ using the etch depth shortage ($D_{set}-D1_{act}$).

This technique corrects the influence of overetching in the step of etching the upper-layer film 32 to calculate the etch time $T_{add}$ for the additional etching process when the to-be-etched film has the two-layer structure shown in FIG. 5. Therefore, the third preferred embodiment improves the accuracy of the etch depth after the additional etching process to contribute to the improvements in the semiconductor device manufacturing yield.

Although the calculation of the etch time for the additional etching process is discussed above, it is similarly effective to calculate the etch time for the lower-layer film 31 in the normal etching process based on the etch rate of its immediately preceding etching operation of the lower-layer film 31. For example, etch time T31 for the lower-layer film 31 in the normal etching process of another wafer which immediately follows the above-mentioned normal etching process is calculated as $T31=D_{set}/((D1_{act}-D_v)/T1)$. This improves the accuracy of the etch depth in the normal etching process when the to-be-etched film has the two-layer structure, to reduce the number of wafers which need the additional etching process in the etching apparatus according to the third preferred embodiment, thereby contributing to the improvements in the semiconductor device manufacturing efficiency.

Fourth Preferred Embodiment

The etch rate is calculated in the second preferred embodiment based on the assumption that the etch rate is fixed independently of the etch time.

Figure 6:
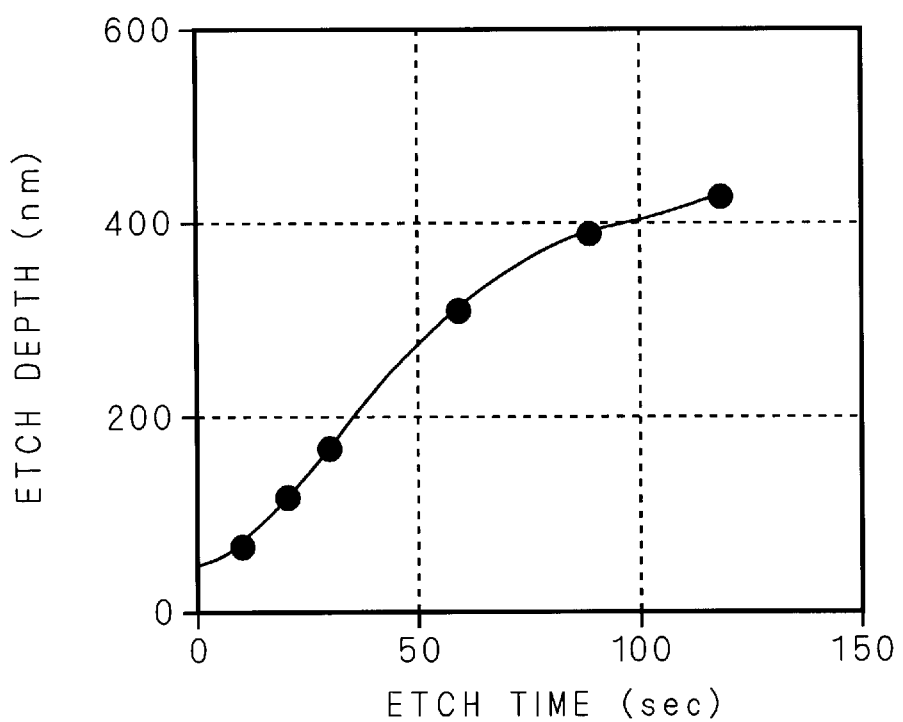
FIG. 6 is a graph showing a relationship between an etch time and an etch depth in a common etching apparatus.

FIG. 6 is a graph showing a relationship between the etch time and the etch depth in a common etching apparatus. It will be found from the graph of FIG. 6 that the etch time and the etch depth are not always in a linear relationship but show different characteristics depending on the material of the to-be-etched film. In other words, the etch rate changes with the etch time in some cases.

In such a case, the actual etch rate estimate is accurately calculated by approximating the etch rate, for example, using a polynomial shown in FIG. 6 concerning the etch time and the etch depth. An example of this polynomial may include data derived from previous experimental etching, and a value calculated from the material of the to-be-etched film and etching conditions.

The etching method according to a fourth preferred embodiment of the present invention uses the polynomial representing a characteristic of the etch rate with the etch time to calculate the etch time for the additional etching process and the etch time for the normal etching process.

Therefore, the etching method according to the fourth preferred embodiment improves the accuracy of the etch depth after the additional etching process when etching the to-be-etched film whose etch rate is not fixed, to contribute to the improvements in the semiconductor device manufacturing yield.

Additionally, the etching method according to the fourth preferred embodiment further improves the accuracy of the etch depth in the normal etching process to reduce the number of wafers which need the additional etching process in the etching apparatus according to the fourth preferred embodiment, thereby contributing to the improvements in the semiconductor device manufacturing efficiency.

Fifth Preferred Embodiment

The second preferred embodiment has shown the technique of causing the etching process for each wafer to reflect the etch rate of its immediately preceding etching operation as shown in FIG. 4. However, longer time required to measure the etch depth after the etching process results in a wait, or waiting time, for the etch depth measurement before the etching process of the next wafer. This might significantly reduce the semiconductor device production efficiency.

Since the etch rate is varied only slightly by the processing of a small number of wafers, measuring the etch depth and correcting the etch rate at intervals of several processed wafers are sufficiently effective.

A fifth preferred embodiment according to the present invention does not measure the etch depth of every wafer in the cassette but extracts wafers to be subjected to the etch depth measurement at intervals of a predetermined number of wafers.

Figure 7:
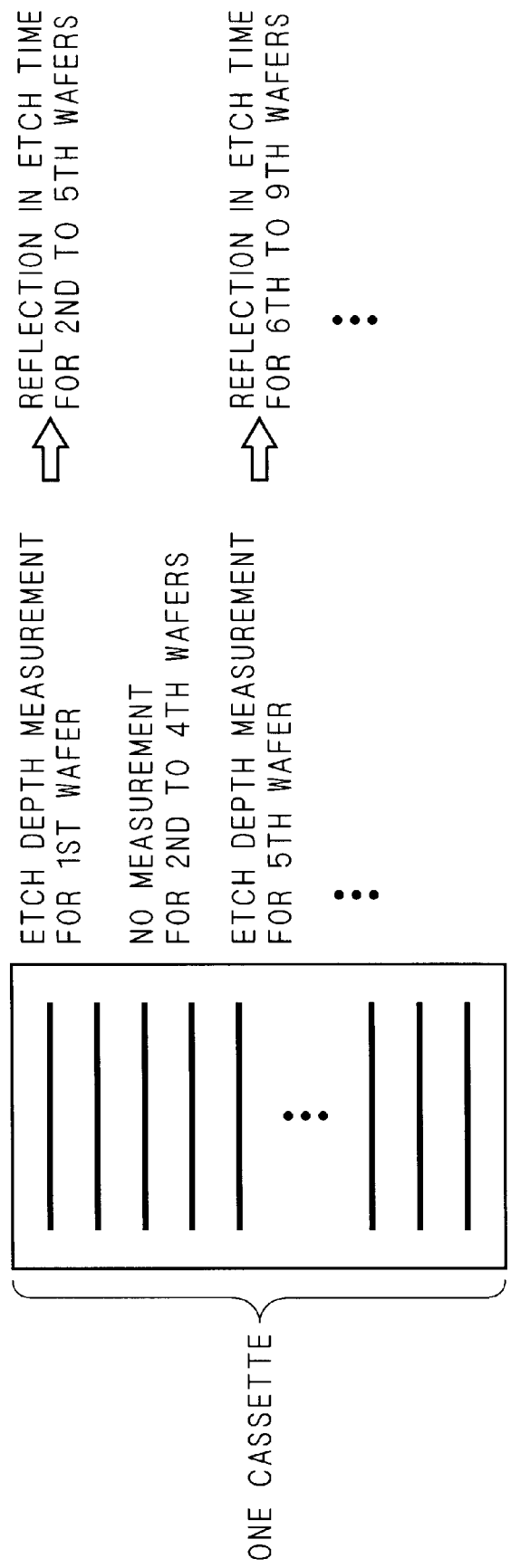
FIG. 7 illustrate an operation of the etching apparatus according to a fifth preferred embodiment of the present invention.

Referring to FIG. 7, for example, the etch rate resulting from the measurement of the etch depth of the first wafer is reflected in the etch time for the second to fifth wafers following the first wafer. Then, the etch rate resulting from the measurement of the etch depth of the fifth wafer is reflected in the etch time for the sixth to ninth wafers.

This reduces the waiting time caused by the long time required to measure the etch depth, to improve the stability of the etch depth while suppressing the reduction in the semiconductor device manufacturing efficiency.

Although the step of trench formation is illustrated as an example of the etching step in the above description and the drawings, applications of the present invention are not limited to this. It will be obvious that the present invention is adaptable to every etching process which etches a film to a depth less than the thickness of the film.

While the invention has been described in detail, the foregoing description is in all aspects illustrative and not restrictive. It is understood that numerous other modifications and variations can be devised without departing from the scope of the invention.

What is claimed is:

1. An etching apparatus having an etching chamber for etching a film formed on a surface of a wafer, and at least one of a buffer chamber and an orienter chamber for establishing an orientation of said wafer, said etching apparatus comprising:

an etching device provided in said etching chamber for performing said etching; and an etch depth measuring device provided in one of said buffer chamber and said orienter chamber for measuring an etch depth resulting from said etching, wherein said etching device additionally performs said etching if said etch depth measured by said etch depth measuring device is less than a predetermined value.

2. The etching apparatus according to claim 1, further comprising a setting device for setting a value of a parameter associated with said etching, wherein said parameter includes an etch depth setting for said etching and an actual etch rate estimate.

3. A method of etching a film formed on a surface of a wafer to a predetermined depth less than the thickness of said film, said method comprising the steps of:

(a) etching said film formed on a surface of a first wafer for first etch time;

(b) measuring a first etch depth, said first etch depth being an actual etch depth resulting from said etching in said step (a); and (c) additionally performing said etching for additional etch time if said first etch depth is less than a predetermined value, wherein said first etch time is calculated from an etch depth setting for said etching in said step (a) and a first etch rate, said first etch rate being an actual etch rate estimate, and wherein said additional etch time is calculated from said etch depth setting, said first etch depth and an additional etch rate, said additional etch rate being an actual etch rate estimate for said etching in said step (c).

4. The method according to claim 3, wherein said additional etch rate is said first etch rate.

5. The method according to claim 3, wherein said additional etch rate $R_{add}$ is calculated in accordance with the equation $$R_{add} = D1_{act}/T1$$

where $D1_{act}$ is said first etch depth, and T1 is said first etch time.

6. The method according to claim 3, wherein said first wafer further includes an upper-layer film on said film, said method further comprising the step of (d) etching said upper-layer film, said step (d) being performed before said step (a), wherein said additional etch rate $R_{add}$ is calculated in accordance with the equation $$R_{add} = (D1_{act} - D_v)/T1$$

where $D1_{act}$ is said first etch depth, $D_v$ is an overetch depth in an upper surface of said film in said step (d), and T1 is said first etch time.

7. The method according to claim 3, further comprising the steps of:

(e) performing said etching on said film formed on a surface of a second wafer for second etch time; and (f) measuring a second etch depth, said second etch depth being an actual etch depth resulting from said etching in said step (e), wherein said additional etch rate $R_{add}$ is calculated in accordance with the equation $$R_{add}=D2_{act}/T2$$

where $D2_{act}$ is said second etch depth, and T2 is said second etch time.

8. The method according to claim 7, wherein said steps (e) and (f) are performed after said step (a) and before said step (c).

9. The method according to claim 8, wherein said steps (e) and (f) are performed immediately before said step (c).

10. The method according to claim 3, further comprising the step of (g) approximating a relationship between an etch rate and etch time of said film using a polynomial, wherein said additional etch rate is calculated based on said polynomial.

11. The method according to claim 3, further comprising the steps of:

(h) performing said etching on said film formed on a surface of a third wafer for third etch time, said step (h) being performed before said step (a); and (i) measuring a third etch depth, said third etch depth being an actual etch depth resulting from said etching in said step (h), wherein said first etch rate R1 is calculated in accordance with the equation $$R1=D3_{act}/T3$$

where $D3_{act}$ is said third etch depth, and T3 is said third etch time.

12. The method according to claim 11, wherein said steps (h) and (i) are performed immediately before said step (a).

13. A method of etching a film formed on surfaces of a plurality of wafers to a predetermined depth less than the thickness of said film, said method comprising the steps of:

(a) performing said etching on said film formed on a surface of a first wafer for first etch time;

(b) measuring an actual etch depth resulting from said etching in said step (a); and (c) performing said etching on said film formed on a surface of a second wafer for second etch time, said step (c) being performed after said step (b), wherein said second etch time T2 is calculated in accordance with the equation $$T2=D_{set}/(D_{act}/T1)$$

where $D_{set}$ is an etch depth setting for said etching, $D_{act}$ is said actual etch depth measured in said step (b), and T1 is said first etch time.

14. The method according to claim 13, wherein said steps (a) and (b) are performed immediately before said step (c).

* * * * *